(12) United States Patent
Cilia et al.

(10) Patent No.: US 6,172,879 B1
(45) Date of Patent: Jan. 9, 2001

(54) BGA PIN ISOLATION AND SIGNAL ROUTING PROCESS

(75) Inventors: Michael C. Cilia, Milpitas; Don Nguyen, Sunnyvale; Gurpreet S. Dayal, Fremont, all of CA (US)

(73) Assignee: Sun Microsystems, Inc., Palo Alto, CA (US)

( * ) Notice: Under 35 U.S.C. 154(b), the term of this patent shall be extended for 0 days.

(21) Appl. No.: 09/107,757

(22) Filed: Jun. 30, 1998

(51) Int. Cl.[7] .................................. H05K 1/18; H05K 3/34
(52) U.S. Cl. .................... 361/778; 361/760; 361/779; 361/783; 257/738; 257/786; 174/260; 174/261; 438/108; 438/128; 438/129; 29/840; 29/850; 228/180.21; 228/180.22
(58) Field of Search .................................. 361/760, 772, 361/777–779, 782, 783, 805, 826, 827; 174/52.1, 59, 260, 261; 257/690, 692, 693, 697, 723, 724, 734, 737, 738, 773, 776, 778, 780, 784, 786, 798; 438/14, 15, 106, 108, 118, 125, 128, 129, 800; 29/830–832, 840, 842, 843, 846, 850, 854, 857, 860; 228/180.21, 180.22

(56) References Cited

U.S. PATENT DOCUMENTS

| | | | |
|---|---|---|---|
| 3,626,086 | * | 12/1971 | Rubey ................................. 361/826 |
| 3,969,816 | * | 7/1976 | Swengel, Sr. et al. .............. 361/779 |
| 4,996,629 | * | 2/1991 | Christiansen et al. ............... 361/783 |
| 5,347,428 | * | 9/1994 | Carson et al. ....................... 361/760 |
| 5,768,109 | * | 6/1998 | Gulick et al. ........................ 361/783 |
| 5,809,641 | * | 9/1998 | Crudo et al. ............................ 29/840 |
| 5,872,403 | * | 2/1999 | Bowman et al. .................... 257/780 |
| 5,909,011 | * | 6/1999 | Chartrand et al. ................... 174/261 |
| 6,038,135 | * | 3/2000 | Higashiguchi et al. ............. 361/778 |

* cited by examiner

Primary Examiner—Jeffrey Gaffin
Assistant Examiner—John B. Vigushin
(74) Attorney, Agent, or Firm—Townsend and Townsend and Crew LLP

(57) ABSTRACT

A method for isolating a pin of a ball grid array (BGA) device mounted on a printed circuit board, and routing the signal carried by the isolated pin to an alternate location. The BGA device pin is isolated by removing the solder ball to expose the device pad. A rework or engineering wire is then soldered to the BGA device pad using a high temperature solder. The rework wire is then routed between the other solder pads to the edge of the BGA device package. The BGA device is then reflowed at a temperature lower than the reflow temperature of the high temperature solder. The rework wire is used to route the signal carried by the isolated BGA pin to an alternate location. The present invention provides for higher process yields than conventional rework processes.

14 Claims, 5 Drawing Sheets

BGA PIN ISOLATION AND SIGNAL ROUTING PROCESS

BACKGROUND OF THE INVENTION

The present invention relates generally to printed circuit board assembly processes. More particularly, the present invention relates to a method for isolating a pin of a ball grid array device mounted on a printed circuit board and routing the signal carried by the isolated pin to a new location by attaching a rework wire to the isolated pin.

There has been a steady increase in the densities of circuit assemblies on printed circuits boards (PCB). This increase has been fueled by an ever increasing demand for faster circuit speeds which require minimum distances between circuit packages, increased complexity of functional circuitry, and miniaturization of circuit devices with higher pin counts. Increased densities of PCB assemblies have in turn made it more difficult to perform PCB rework tasks which are frequently required to incorporate design changes, or to correct faults detected during testing or to increase the reliability of PCBs. The increased complexity of performing rework tasks has in turn increased both the total cost and time required to fabricate PCBs. Thus, the efficiency and effectiveness of a rework process directly affects the process yield and reliability of the PCB assembly and fabrication process.

Conventionally, rework processes involving pin isolation and signal routing, are performed entirely on the PCB itself. This is usually accomplished by performing a trace cut on the PCB and attaching a rework wire or an engineering change (E/C) wire to the trace cut or rework bond pad on the PCB. The rework wire is then used to route the signal from the integrated circuit to an alternate PCB location. This method, however, is not feasible for newer devices, such as Ball Grid Array (BGA) ASIC devices, or other BGA devices in which the spacing between the device pins is reduced so much as to prevent the use of rework bond pads. The only alternative in such situations is to perform a trace cut on the PCB, solder the rework wire directly to the trace on the PCB and then route the wire to the new location.

The phrase "BGA device" as used in this specification refers to a BGA package with the IC housed in the package. The word "pin" as used in the BGA device context refers to a device pad on the BGA package which has a ball of solder attached to it.

The flow chart in FIG. 1 depicts a conventional method for isolating BGA device pins and routing the pin signals to alternate locations. As shown in FIG. 1, at step 2, a trace cut is made on the PCB at the BGA site. At step 4, the solder layer covering the trace is peeled off to allow soldering of a rework wire to the trace. Next, at step 6, a rework solder wire is attached to the BGA trace close to the pad on the PCB using a high temperature solder. The rework wire is not allowed to touch the pad because the signal which is being carried by the PCB device requires the solder ball to be in contact with the pad. The rework wire is soldered to the trace using a high temperature solder which will not reflow when the BGA device reflows.

At step 8, the rework wire is routed on the PCB between the BGA pads. At step 10, the rework wire may optionally be secured by attaching it to the PCB. The BGA device is then screen printed at step 12. At step 14, the BGA device is placed in a BGA reflow system and reflowed. Finally, at step 16, the rework wire is used to route the signal at the repaired location on the PCB to an alternate location on the PCB.

FIG. 2 depicts a PCB 26 illustrating the results obtained by using the prior art method, described above, for performing BGA device pin isolation. As shown in FIG. 2, signal trace 24 on PCB 26 is cut and a rework wire 20 is attached to trace 24, close to PCB pad 22, using a high temperature solder. As discussed above, rework wire 20 is not allowed to actually touch PCB pad 22. Rework wire 20 is soldered to trace 24 with a high temperature solder such that the rework wire bond does not reflow when the BGA package reflows.

The above described rework process has several disadvantages which lower the process yield and reduce the reliability of the PCB rework process. In particular, since the rework wire is generally located on the PCB in the BGA pad matrix, the PCB can no longer be screen printed. This is because, on many occasions, the PCB is reworked before any assembly takes place and hence the entire PCB cannot be screen printed due to the rework wire attached to the PCB pad. As a result, each reworked BGA device has to be screen printed individually, leading to loss of time and increased cost of the PCB rework process. The process is further complicated by the need to use solder paste when placing a new BGA device on the PCB. Screen printing a device lowers the volume of solder paste because the solder balls protruding through the stencil lower the deposition volume. Lower paste volumes can cause open circuits due to the volume of solder and flux which make up the solder paste.

Thus, it is desirable to provide a effective and efficient method for performing pin isolation and signal routing for closely spaced pins of a BGA device which also increases the process yield and reliability of the rework process.

SUMMARY OF THE INVENTION

According to the present invention, a method is disclosed for isolating a BGA device pin or other type of BGA pin on a printed circuit board (PCB) and routing the signal carried by the isolated pin to an alternate location by attaching a rework wire to the isolated pin device pad. The method according to the present invention provides an effective and efficient technique for performing pin isolation and signal routing for closely spaced pins of a BGA device while increasing the process yield and reliability of the rework process.

According to one aspect of the present invention, the need to perform a trace cut on the PCB to achieve BGA pin isolation is obviated. The present invention accomplishes pin isolation by removing the solder ball surrounding the device pad on the BGA package for the BGA pin to be isolated. A rework wire is then soldered to the exposed BGA device pad, rather than to a trace on the PCB. The rework wire is then routed to the outside of the BGA device package along the underside of the BGA device. The rework wire is then used to route the signal carried by the isolated BGA device pin to an alternate location.

According to another aspect of the present invention, BGA pin isolation is achieved with minimal process modifications to downstream processes related to removal and replacement of BGA devices. The present invention allows screen printing of the PCB rather than screen printing each device. Furthermore, downstream processes for reworking a BGA device, such as using a stencil for printing the BGA pads, or placement of a BGA device using localized heating and device reflow processes, do not have to be changed.

Further understanding of the nature and advantages of the invention may be realized by reference to the remaining portions of the specification and drawings.

DESCRIPTION OF SPECIFIC EMBODIMENTS

In accordance with the teachings of the present invention, a method is taught for isolating a pin of a BGA device mounted on a PCB and routing the signal carried by the isolated pin to an alternate location on the PCB using a rework or engineering change (E/C) wire. The present invention provides higher process yields and increases the overall reliability of the PCB rework process.

Figure 1:
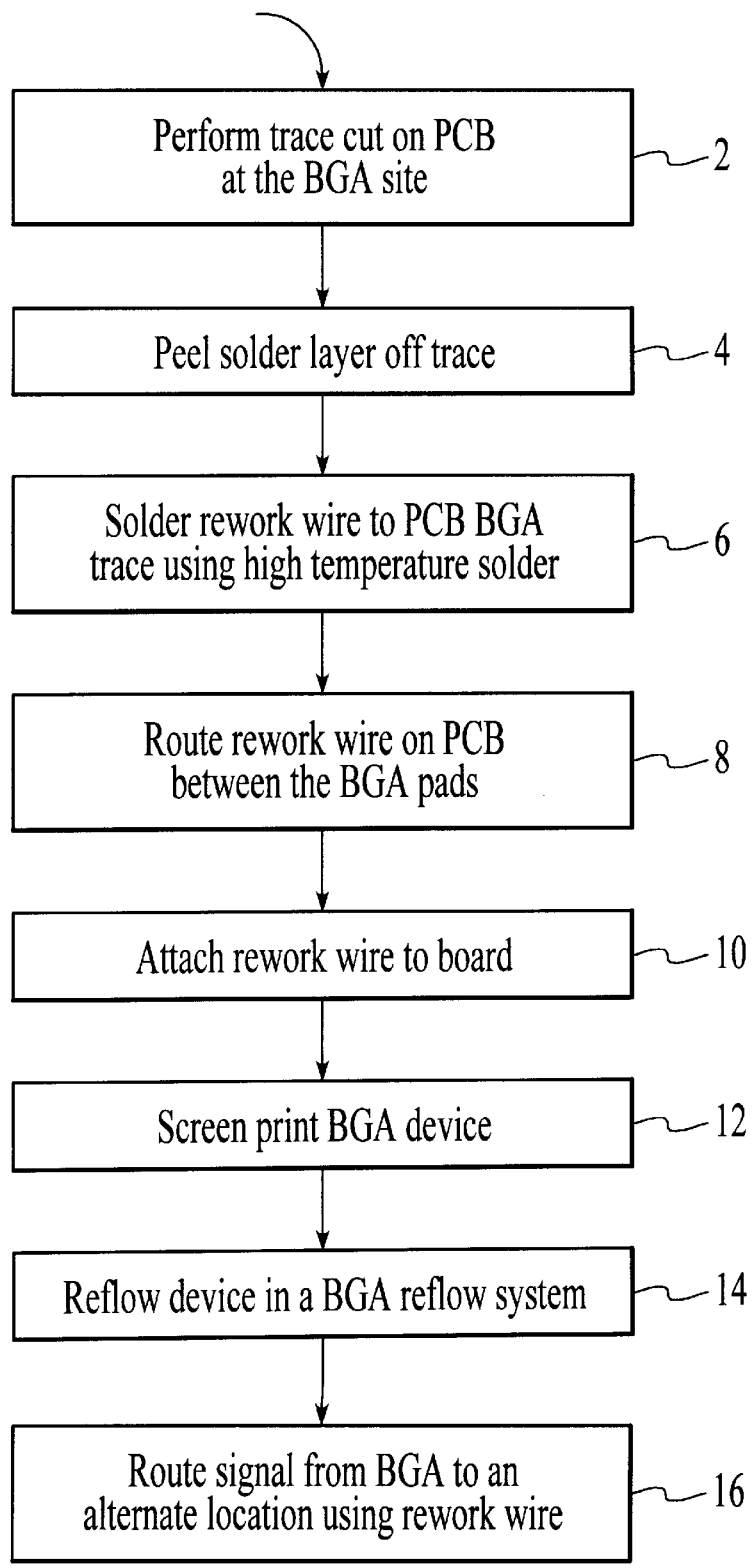
FIG. 1 depicts a flow chart showing the prior art method of pin isolation for a BGA device.
Figure 2:
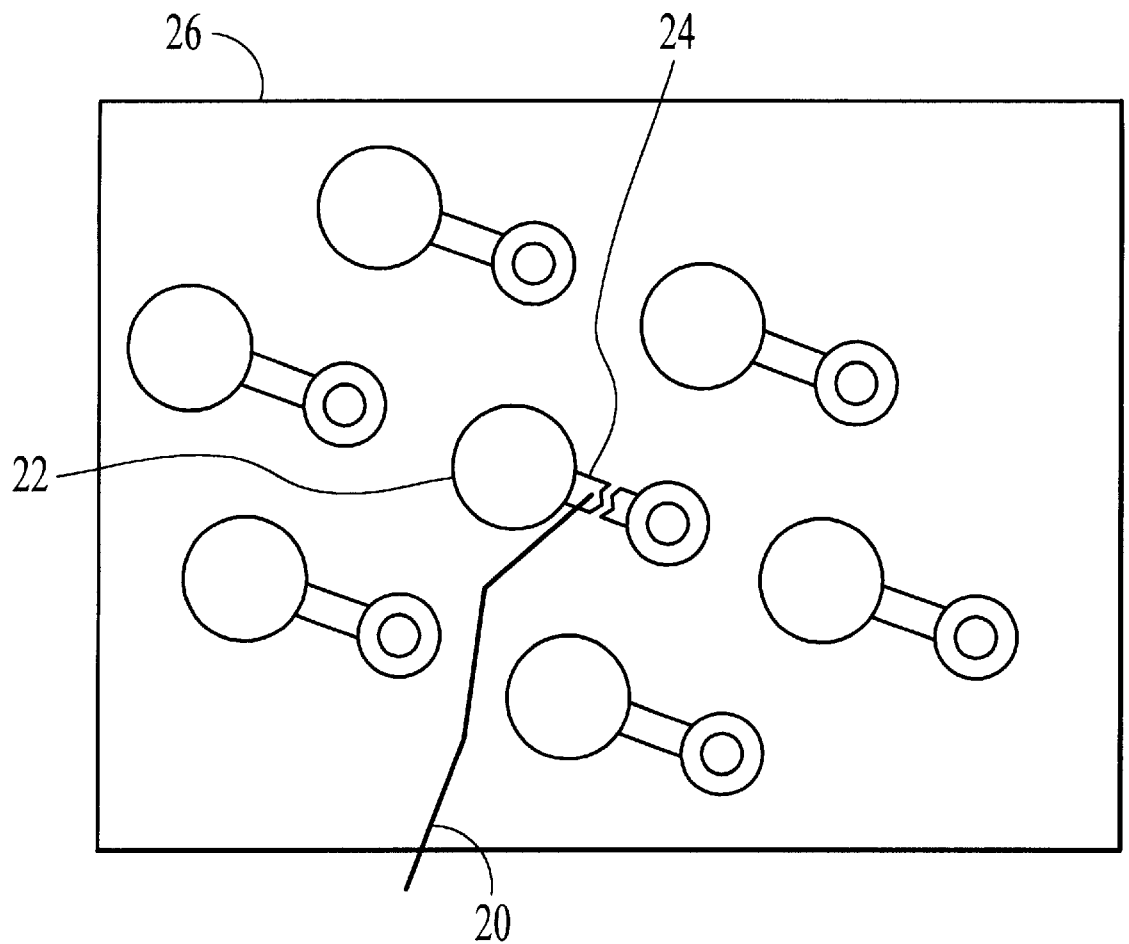
FIG. 2 depicts a PCB reworked using conventional methods for BGA pin isolation and pin signal routing.
Figure 3:
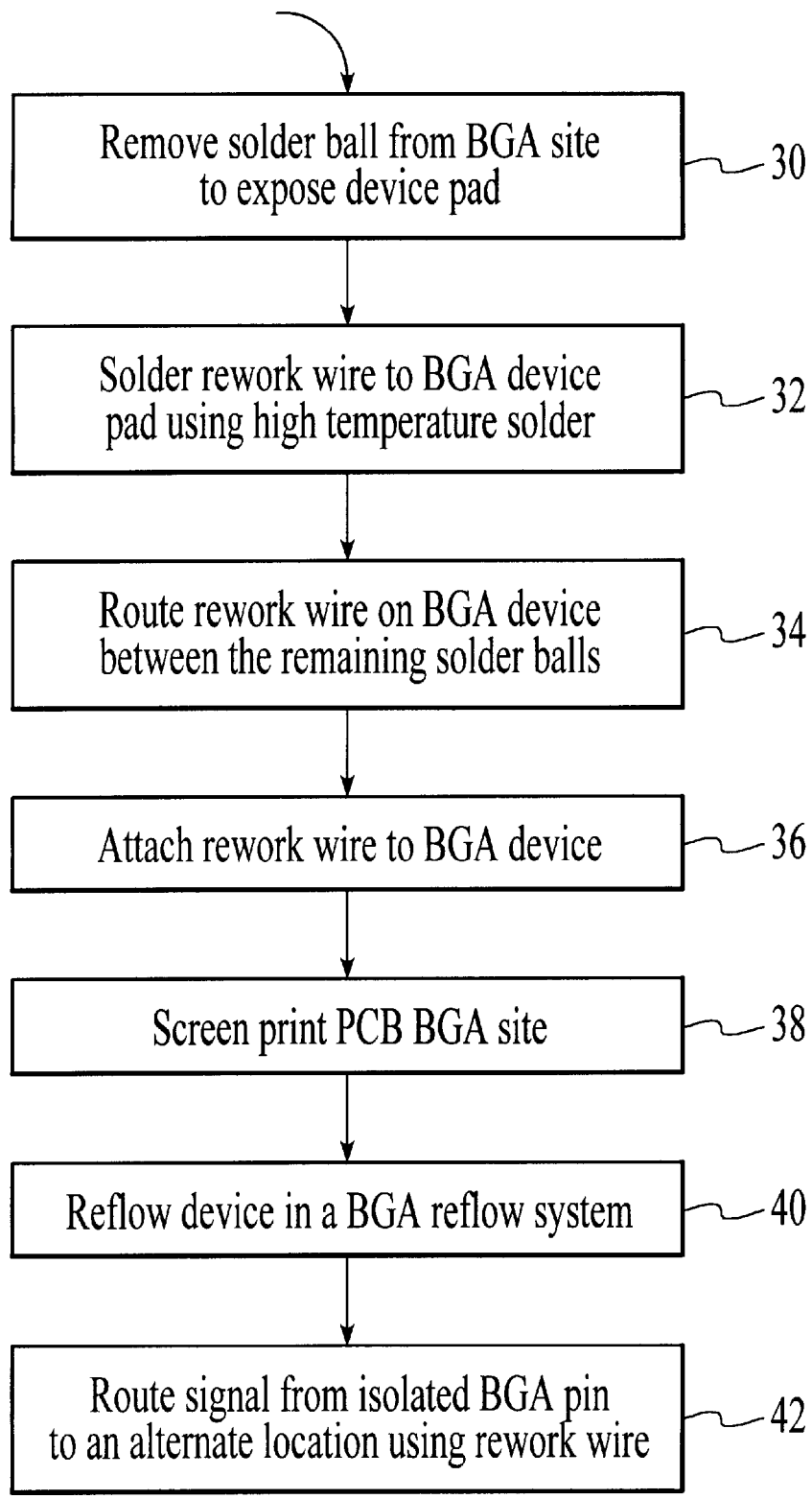
FIG. 3 depicts a flow chart showing a novel method for pin isolation and signal routing according to an embodiment of the present invention.

FIG. 3 is a flow chart depicting a novel method for BGA pin isolation and pin signal routing according to an embodiment of the present invention. As depicted in FIG. 3, at step 30, a BGA device pin is isolated by removing the solder ball surrounding the device pad corresponding to the pin. This is usually accomplished by using a soldering iron preferably with a small tip. A flux is applied to the tip of the soldering iron and the solder ball is carefully touched with the iron tip.

Next, at step 32, a rework wire is soldered to the exposed BGA device pad using a high temperature solder. In an exemplary embodiment, the high temperature solder preferably reflows at temperatures above 220 degrees Celsius. Examples of rework wires which can be used in conjunction with the present invention include a 2.2 mm thick insulated copper wire, part number C66L-0340-0004, manufactured by Fujitsu.

At step 34, the rework wire is routed along the underside of the BGA device and between the remaining solder balls to the outside of the BGA device package. In an exemplary embodiment, the rework wire is routed such that a tail protrudes beyond the edge of the BGA device. This tail is used for routing the pin signal to a location outside the BGA device or chip periphery. At step 36, the rework wire may optionally be secured by attaching it to the BGA device using an adhesive. In an exemplary embodiment, adhesives such as Loctite 44 are used, with Loctite 7452 acting as an accelerator.

At step 38, conventional localized screen printing of the PCB BGA site is performed using means such as mini-stencils or other similar devices. The present invention thus allows screen printing of the PCB, rather than screen printing each reworked device, as in prior art techniques. The process of screen printing the PCB provides a larger volume of solder paste than screen printing a device. This in turn reduces open circuit problems associated with screen printing of devices.

The BGA device is then placed in a BGA reflow system and reflowed at step 40. The PCB BGA site is reflowed at a temperature which is less than the reflow temperature of the high temperature solder used to solder the rework wire to the BGA device pad. This prevents the rework wire solder from reflowing during reflow of the PCB BGA site. The rework wire thus remains attached to the device pad. In an exemplary embodiment, the PCB reflow temperature is at least 20 degrees Celsius less than the reflow temperature of the high temperature solder. In a preferred embodiment, the high temperature rework wire solder reflows at approximately 220 degrees Celsius and the PCB reflow process is performed at approximately 183 degrees Celsius.

At step 42, the rework wire tail is used to route the signal carried by the isolated BGA pin to an alternate site on the PCB. The BGA device may then optionally be inspected using inspection devices such as X-ray machines. Inspections are generally performed to verify that the rework wire has been properly routed between the solder balls on the BGA device such that the rework wire does not short circuit to any of the solder balls.

As described above, according to the teachings of the present invention, pin isolation and signal routing is performed by attaching the rework wire to the BGA device pad rather than to a trace on the PCB as done in the prior art. Thus, the present invention eliminates the need to make trace cuts on the PCB. This allows downstream operations of BGA device removal and replacement to remain unchanged.

Figure 4:
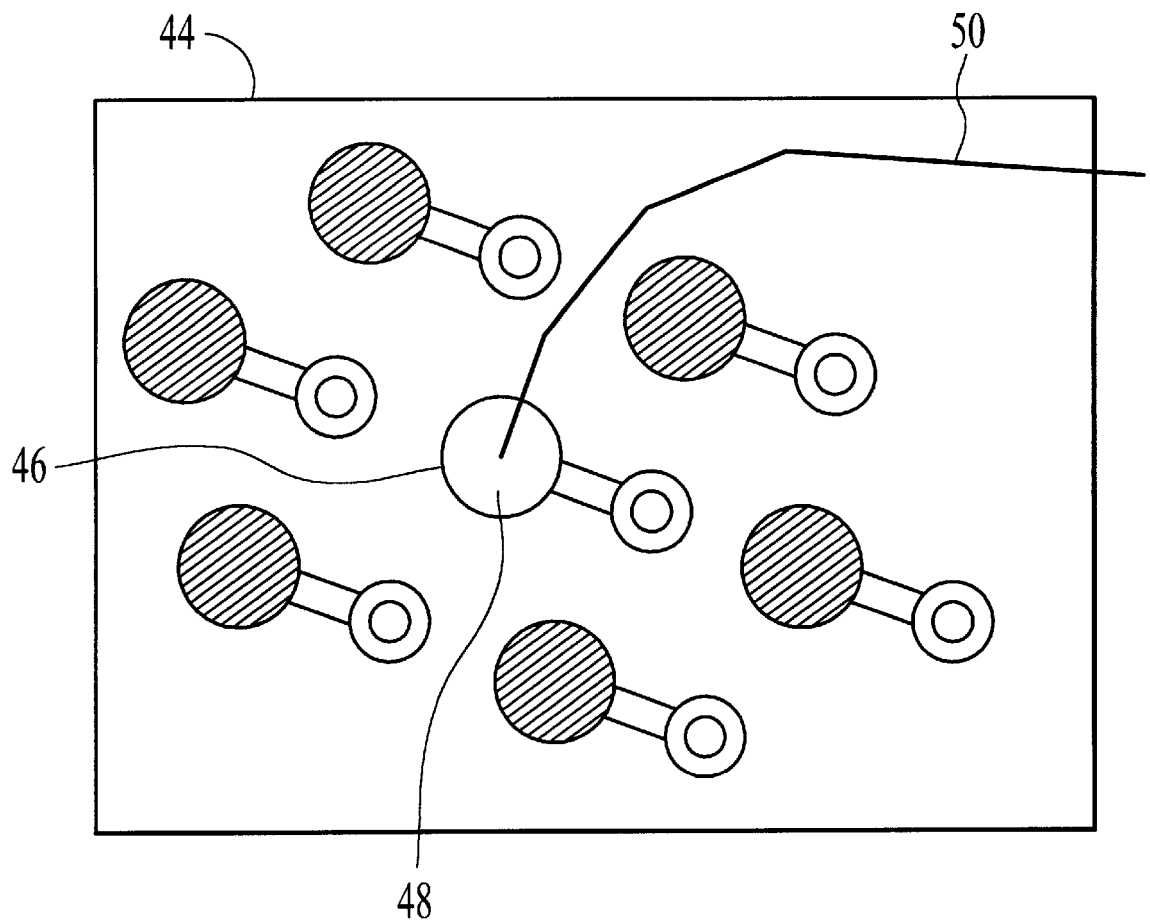
FIG. 4 depicts a BGA device reworked according to the teachings of the present invention.

FIG. 4 depicts a BGA device 44 with a plurality of pins reworked according to the teachings of the present invention. As previously discussed, the word "pin" as used in the BGA context refers to a device pad on the BGA device which is surrounded by a solder ball. As shown in FIG. 4, BGA pin 46 has been isolated by removing the solder ball surrounding device pad 48. In accordance with the teachings of the present invention, rework wire 50 has been attached to exposed device pad 48 using a high temperature solder.

Figure 5:
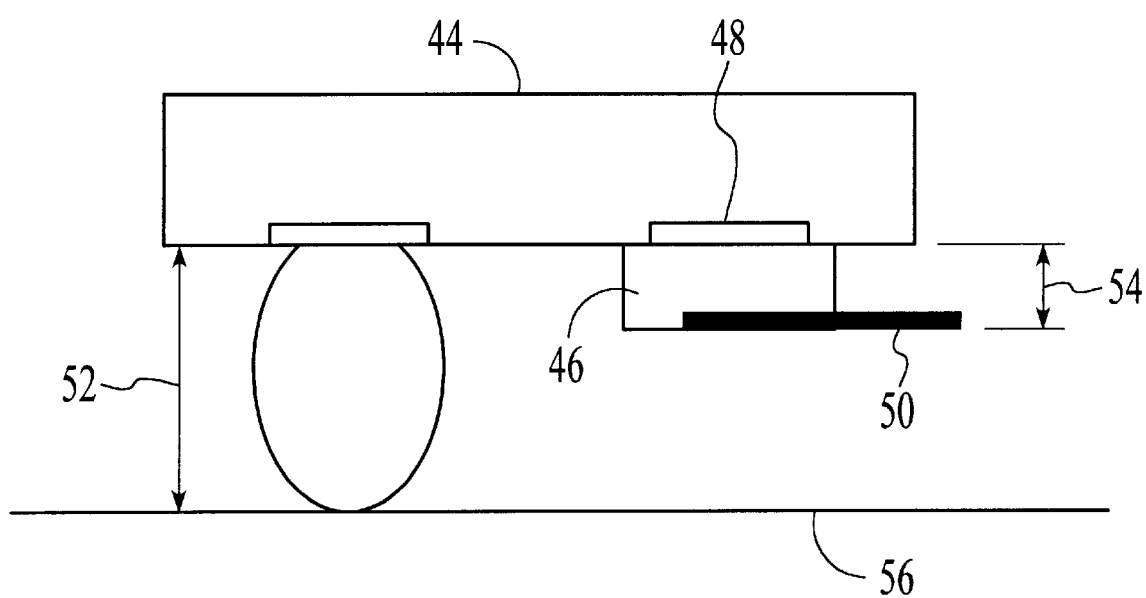
FIG. 5 depicts a side-view of a BGA pin isolated according to the teachings of the present invention.

FIG. 5 depicts a side view of isolated pin 46 of BGA device 44 mounted on PCB 56. As shown, the rework wire is soldered to device pad 48 in a manner such that height 54 of the rework wire solder joint is always less than height 52 of the solder ball. This ensures that there is always some clearance between the rework wire joint and the PCB. In an exemplary embodiment, height 54 of the wire bond solder joint is approximately 0.005 inches. In this exemplary embodiment, the height 52 of a solder ball on BGA device 44 is typically 0.026 inches. When the PCB BGA site is reflowed, as per step 40 in FIG. 4, height 52 of the solder joint ranges anywhere from 0.010 and 0.020 inches depending on the weight of BGA device 44. This still leaves a worst case clearance of approximately 0.005 inches between rework wire 50 soldered to device pad 48 and the PCB pad. This clearance provides the required pin isolation and eliminates the need to make a trace cut on the PCB.

Conclusion

In the foregoing specification, the invention has been described with reference to specific exemplary embodiments thereof. Many changes or modifications are readily envisioned. Although the present invention has been described using a BGA device, it should be apparent to those skilled in the art that the present invention can be applied to rework of other PCB devices and packages having solder ball arrays. For example, the present invention can be used to rework chip scale packages (CSPs) having solder ball arrays.

The specification and drawings are, accordingly, to be regarded in an illustrative rather than a restrictive sense. It will, however, be evident that other modifications and changes may be made thereunto without departing from the broader spirit and scope of the invention as set forth in the claims.

What is claimed is:

1. A method for isolating a pin of a ball grid array device mounted on a printed circuit board and routing a signal carried by said isolated pin to a new location, said method comprising:

removing a solder ball to expose a device pad corresponding to said pin;

attaching a rework wire to said device pad using a solder having a first reflow temperature;

routing said rework wire to outside of said ball grid array device;

reflowing said ball grid array device at a second reflow temperature, said second reflow temperature lower than said first reflow temperature;

using said routed rework wire to route said signal carried by said pin to said new location.

2. The method of claim 1 wherein said first reflow temperature is at least 20 degrees Celsius higher than said second reflow temperature.

3. The method of claim 1 wherein said first reflow temperature is approximately 220 degrees Celsius and said second reflow temperature is approximately 183 degrees Celsius.

4. The method of claim 1 further comprising a step of screen printing said printed circuit board, said screen printing step performed after said step of attaching said rework wire to said device pad.

5. The method of claim 1 further comprising a step of attaching said rework wire to said ball grid array device by using an adhesive.

6. A method of reworking a printed circuit board, comprising:

providing said printed circuit board;

providing a ball grid array device mounted on said printed circuit board, said ball grid array device comprising a plurality of pins;

isolating a pin of said plurality of pins by removing a solder ball to expose a device pad corresponding to said pin;

attaching a rework wire to said device pad connected to said pin using solder having a first reflow temperature;

routing said rework wire to outside of said ball grid array device;

reflowing said ball grid array device at a second reflow temperature, said second reflow temperature lower than said first reflow temperature;

using said rework wire to route a signal carried by said pin to a new location.

7. The method of claim 6 wherein said first reflow temperature is at least 20 degrees Celsius higher than said second reflow temperature.

8. The method of claim 6 wherein said first reflow temperature is approximately 220 degrees Celsius and said second reflow temperature is approximately 183 degrees Celsius.

9. The method of claim 6 further comprising a step of screen printing said printed circuit board, said screen printing step performed after said step of attaching said rework wire to said device pad.

10. The method of claim 6 further comprising a step of attaching said rework wire to said ball grid array device by using an adhesive.

11. A printed circuit board comprising;

a ball grid array device mounted on said printed circuit board, said ball grid array device having a plurality of pins;

an isolated pin of said plurality of pins, said isolated pin having its solder ball removed and its device pad exposed;

a rework wire attached to said exposed device pad using a solder having a first reflow temperature, said first reflow temperature higher than a second reflow temperature for said ball grid array device, said rework wire for routing a signal carried by said isolated pin to a new location.

12. The printed circuit board of claim 11 wherein said first reflow temperature is at least 20 degrees Celsius higher than said second reflow temperature.

13. The printed circuit board of claim 11 wherein said first reflow temperature is approximately 220 degrees Celsius and said second reflow temperature is approximately 183 degrees Celsius.

14. The printed circuit board of claim 11 wherein said rework wire is attached to said ball grid array device using an adhesive.

* * * * *